(12) United States Patent
Delpech et al.

(10) Patent No.: US 6,271,574 B1
(45) Date of Patent: Aug. 7, 2001

(54) INTEGRATED CIRCUIT FUSE WITH LOCALIZED FUSING POINT

(75) Inventors: Philippe Delpech, Meylan; Nathalie Revil, Grenoble, both of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/310,264

(22) Filed: May 12, 1999

(30) Foreign Application Priority Data

May 14, 1998 (FR) ................................ 98 06071

(51) Int. Cl.[7] ................................................ H01L 29/00
(52) U.S. Cl. ........................ 257/529; 438/132; 438/467
(58) Field of Search ........................... 257/529; 438/132, 438/467, 601

(56) References Cited

U.S. PATENT DOCUMENTS

| | | | |
|---|---|---|---|
| 4,895,780 | 1/1990 | Nissan-Cohen et al. | 430/5 |
| 5,208,124 | 5/1993 | Sporon-Fiedler et al. | 430/5 |
| 5,589,706 | * 12/1996 | Mitwalsky et al. | 257/529 |
| 5,608,257 | 3/1997 | Lee et al. | 257/529 |
| 5,708,291 | 1/1998 | Bohr et al. | 257/529 |
| 5,970,346 | * 10/1999 | Liaw | 438/281 |
| 6,008,716 | * 12/1999 | Kokubun | 257/529 |

FOREIGN PATENT DOCUMENTS

| | | |
|---|---|---|
| 0 313 815 A2 | 9/1988 | (EP) . |
| 2 758 007 | 12/1997 | (FR) . |
| 1-169942 | 7/1989 | (JP) . |

OTHER PUBLICATIONS

Mohsen Alavi et al., "A PROM Element Based on Salicide Agglomeration of Poly Fuses in a CMOS Logic Process" IEDM97 (Dec. 1997) pp. 855–858.*

* cited by examiner

Primary Examiner—Sara Crane
(74) Attorney, Agent, or Firm—Theodore E. Galanthay; Allen, Dyer, Doppelt, Milbrath & Gilchrist, P.A.

(57) ABSTRACT

An integrated circuit fuse includes a substantially bar-shaped central region and zones having electrical contacts. The central region includes a thinned zone forming a weak point facilitating fusing of the fuse by increasing the local current density as compared to standard fusing conditions. The thinned zone is preferably obtained by proximity optical effect between the fuse and adjacent dummy elements.

26 Claims, 4 Drawing Sheets

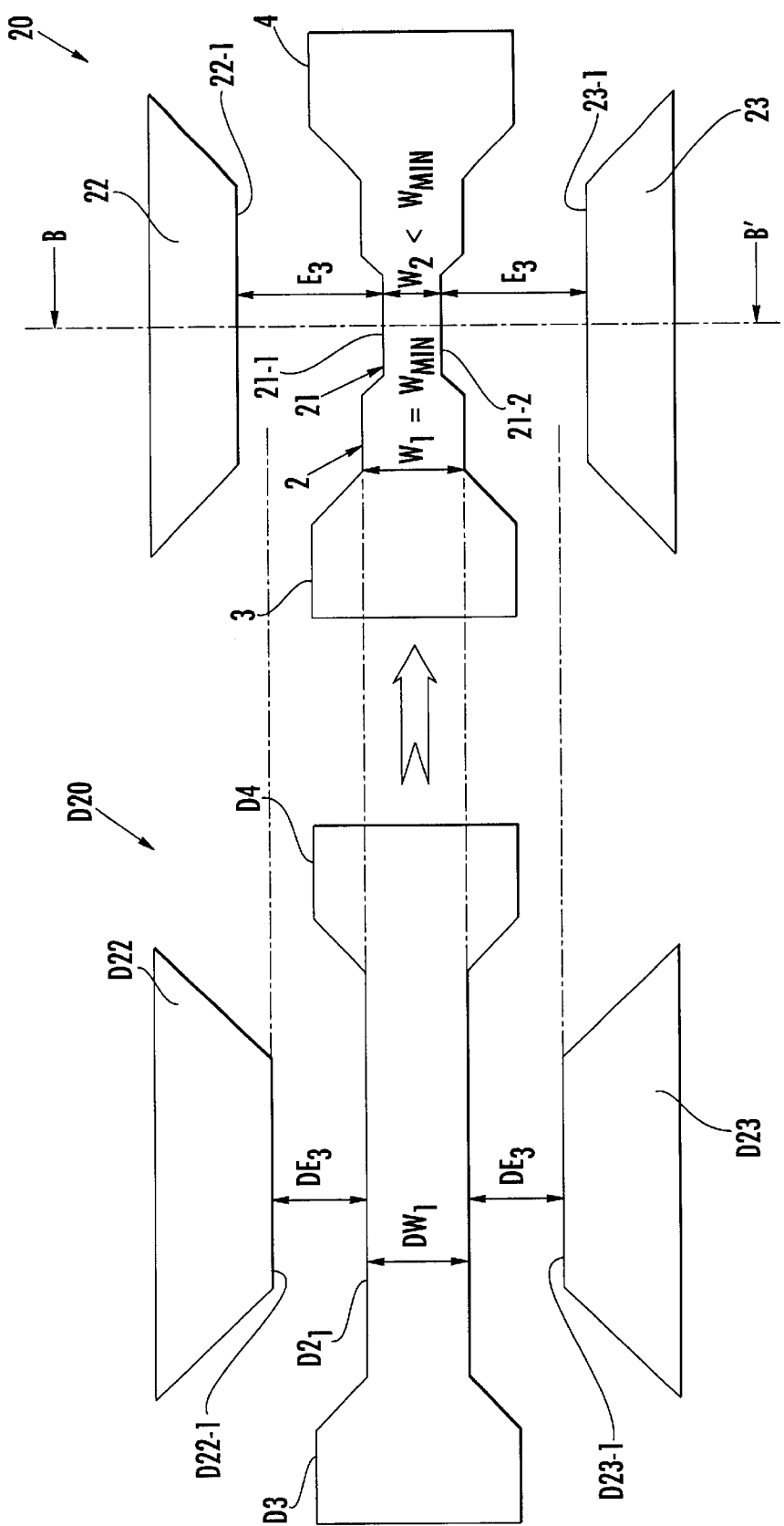

INTEGRATED CIRCUIT FUSE WITH LOCALIZED FUSING POINT

FIELD OF THE INVENTION

The present invention relates to the field of integrated circuits, and, more particularly, to an integrated circuit fuse.

BACKGROUND OF THE INVENTION

Providing fuses in integrated circuits is a practice well-known to those skilled in the art, especially in the manufacture of MOS circuits. For example, it is standard practice to provide fuses to protect MOS transistor gates against the accumulation of electrostatic charges which appear during the manufacture of integrated circuits. These fuses are then disrupted or fused to release the gates of the transistors. As another example, providing redundant word lines or bit lines in large capacity memories also relies on the use of fuses. The defective or unnecessarily redundant lines are then isolated from the rest of the memory by fusing or disrupting the fuses. In general, integrated circuit fuses are designed to be disrupted by the application of a fusing voltage or current to enable the modification of the configuration of a circuit at a final stage of manufacture.

A prior art fuse made by etching is of the type shown in FIG. 1. A fuse 1 of this kind, with a very simple structure and a small space requirement, includes a small bar-shaped central region 2 that widens out at its ends to form two zones 3, 4 receiving a plurality of electrical contacts 5, 6. In general, as can be seen in FIG. 2 in a sectional view, the fuse 1 is buried in an integrated circuit 10 where it is sandwiched between a lower layer 11 and an upper layer 12 of oxide deposited on a silicon substrate 13. The contacts 5, 6 take the form of metallized holes going through the oxide layer 12 to connect the zones 3, 4 to conductors 14, 15. Conventionally, the whole unit is made by the successive deposition of various layers of oxide, metal and/or polysilicon and by the etching of the layers by photolithography.

In order that the current density in the fuse 1 and the efficiency of the fusing may be a maximum for a given fusing current, the width W of the central region 2 of the fuse is usually chosen to be equal to the technological minimum width $W_{min}$ permitted by the manufacturing technology of the integrated circuit 10. For example, at present, the technological minimum width $W_{min}$ of the MOS type integrated circuits is commonly about 0.25 micrometers with respect to the minimum width of a conductor, i.e., the minimum length of the gates of the MOS transistors.

However, this precaution provides only a relative advantage, given that the technological minimum also determines the size of the other components present in the integrated circuit 10. This is particularly true with transistors, and their capacity to withstand high voltages or currents. Thus, in recent years, the reduction of the technological minimum width through the improvement of technologies has gone hand in hand with a reduction of the permissible fusing voltages and currents. For example, the maximum fusing voltages permitted in medium-scale integrated MOS circuits according to older technology were in the range of 5.5 to 6 volts. For large-scale integrated circuits formed using current technology, the maximum fusing voltages are no more than 1.8 to 2 volts.

Despite providing for a minimum width, a standard fuse does not, in statistical terms, provide a fusing efficiency equal to 100% under standard fusing conditions. In other words, when it is sought to simultaneously fuse or disrupt a set of fuses present in an integrated circuit by applying one or more fusing pulses of current or voltage, it frequently happens that non-disrupted fuses remain. These fuses have an electrical resistance which, although it is higher than their initial electrical resistance, cannot be compared to that of an open circuit. This drawback is reflected in the efficiency of manufacture of the integrated circuits, and becomes more of problem when several tens or even several hundreds of fuses are to be made in the same integrated circuit.

The technological minimum width $W_{min}$ therefore, represents an obstacle in the search for a fuse having high fusing efficiency. It is well known in the field of photolithography that the technological minimum width $W_{min}$ is determined by various technological constraints. In particular, obtaining satisfactory reliability of the gates of the MOS transistors is determined by the technological minimum width $W_{min}$. Furthermore, a phenomenon of diffraction and reflection of light during the isolation of the organic resin etching masks exists, and is known to those skilled in the art as the "proximity optical effect".

Finally, another drawback of standard integrated circuit fuses is that they are not entirely reliable. A certain percentage of disrupted fuses have a tendency to regenerate for reasons as yet poorly explained. The regeneration of a fuse is expressed by the fact that its electrical insulation properties deteriorate, whereas they were initially satisfactory.

SUMMARY OF THE INVENTION

An object of the present invention is to provide an integrated circuit fuse capable of being more easily fused than a standard fuse when conducting an identical current.

Another object of the present invention is to provide a fuse having a fusing efficiency greater than that of standard fuses along with improved reliability.

Yet another object of the present invention is to provide an integrated circuit fuse having a width smaller than a technological minimum width, and a method for manufacturing such a fuse.

These objects are achieved by providing an integrated circuit fuse including a substantially bar-shaped central region and zones including electrical contacts in which the central region has a thinned zone. A smaller width forms a weak point facilitating fusing of the fuse through an increase in the local current density in standard fusing conditions.

The fuse is obtained by photolithography and includes at least one dummy element in the vicinity of the thinned zone. The thinning of the central region is obtained by optical proximity effect between at least one edge of the central region and one edge of the dummy element. Advantageously, the width of the thinned zone is smaller than a technological minimum width used for manufacturing the integrated circuit. The width of the central region outside the thinned zone is substantially equal to the technological minimum width.

According to one embodiment, the thinned zone is substantially symmetrical with respect to the longitudinal axis of the central region, and is formed by two notches made in the edges of the central region.

According to another embodiment, the fuse includes two dummy elements on each side of the thinned zone.

According to yet another embodiment, the fuse is made out of polysilicon.

According to another embodiment, the fuse includes oxide spacers that do not entirely overlap the edges of the thinned zone.

According to another embodiment, the contacts are metallized holes going through an oxide layer covering the fuse to connect the zones of the fuse with the conductive elements.

According to still yet another embodiment, the increase in the electrical resistance of the central region due to the thinned zone is negligible as compared with the total resistance of the fuse. The total resistance includes the resistance of access to the fuse. The access resistance includes the electrical resistance of conductive elements and the electrical resistance of the contacts.

BRIEF DESCRIPTION OF THE DRAWINGS

These objects, features and advantages as well as others of the present invention will be explained in greater detail in the following description of an exemplary embodiment of an integrated circuit fuse according to the present invention, and a method used to obtain a fuse of this kind. This description is made on a non-restrictive basis with reference to the appended drawings, of which:

FIG. 7 represents the initial drawing of a fuse according to the present invention;

FIG. 8 shows the fuse obtained from the drawing of FIG. 7 according to the present invention.

DETAILED DESCRIPTION OF THE PREFERRED EMBODIMENTS

Figure 1:
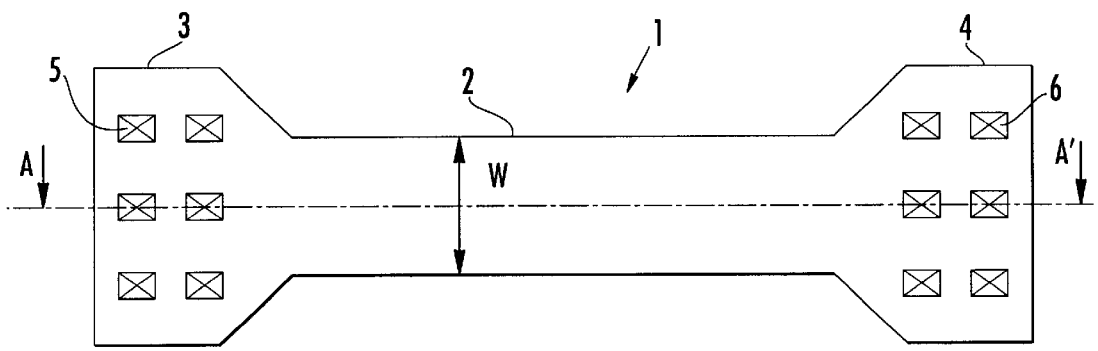
FIG. 1 is a top view of a standard fuse according to the prior art.
Figure 2:
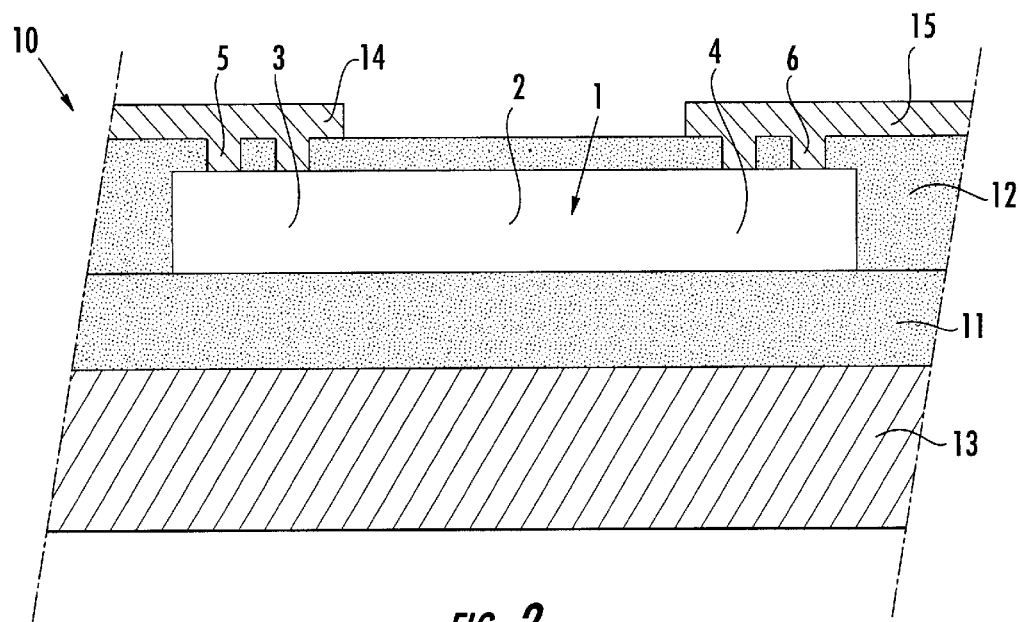
FIG. 2 is a sectional view along an axis AA' of the prior art fuse of FIG. 1 in an integrated circuit.
Figure 3:
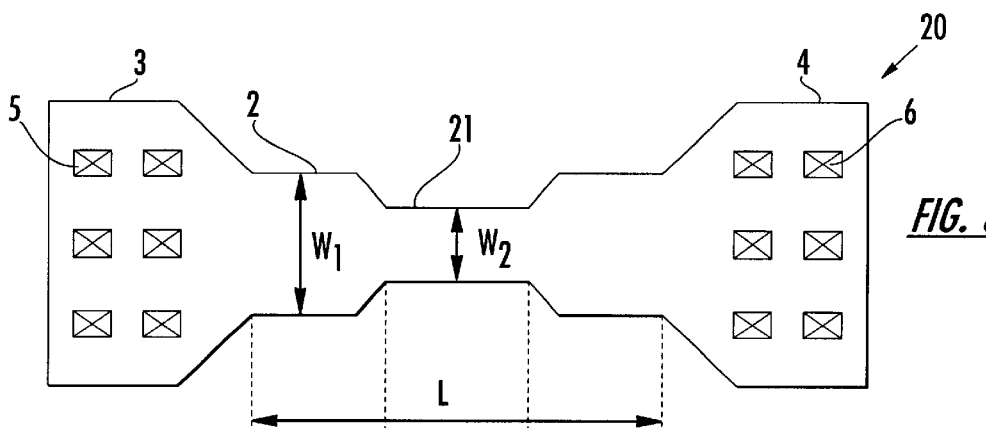
FIG. 3 is a top view of a fuse according to the present invention.

FIG. 3 shows a top view of a fuse 20 according to the present invention. In its general shape, the fuse 20 has the appearance of the standard prior art fuse of FIG. 1. The fuse 20 thus includes a substantially bar-shaped central region 2. In this case, a length L is equal to three times its width $W_1$ there for, and zones 3, 4 are respectively provided with contacts 5, 6. The fuse 20 is made by etching a thin layer of polysilicon, metal or alloy or is made by etching a thin layer formed by a stack of metals or alloys.

According to the present invention, the central region 2 of the fuse 20 has a narrowed feature or thinned zone 21, with a width $W_2$ therefor smaller than the average width $W_1$ therefor of the central region. The width $W_2$ therefor is, for example, equal to half the width W1 as shown in FIG. 3. The thinned zone 21 takes up a small part of the length L of the central region 2. For example, one-third of the length L is preferably positioned at mid-distance from the zones 3, 4.

Advantageously, the thinned zone 21 has a high current density under standard conditions of fusing, e.g., for a given fusing current. This forms a weak point facilitating the fusing or disruption of the fuse. More particularly, the high concentration of current makes the fusing more quickly and more efficient. The fuse according to the present invention provides a higher fusing efficiency and a lower probability of regeneration than a standard fuse.

The thinned zone 21 furthermore makes it possible to localize the breakdown point of the fuse and move it away from the zones 5, 6 where there is a larger quantity of conductive material. This feature of the invention is likely to contribute to obtaining a low probability of regeneration of the fuse and, therefore, to improving its reliability.

Furthermore, the total electrical resistance Rt of the fuse is not significantly increased in comparison with a prior art fuse of the same size. That is, the same fusing current is obtained for a given fusing voltage, or vice versa. This advantage is based on the fact that the total resistance of the fuse is equal to the sum of the resistance of the central region 2, and a resistance of access to the fuse, which is not negligible. The total resistance of the fuse is primarily the measurable resistance from the external pads of an integrated circuit. As an example, the resistance of the central region of a fuse is conventionally about 1 to 10 Ω, depending on the shape of the fuse and the materials used. The access resistance, including the resistance of conductors leading to the fuse and the resistance of the contacts 5, 6, is about 11 Ω.

Figure 4:
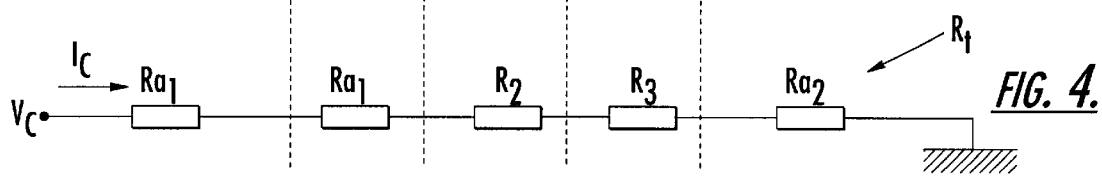
FIG. 4 is an equivalent electrical diagram of the fuse illustrated in FIG. 3 according to the present invention.

As shown in FIG. 4, the total electrical resistance Rt of the fuse 20 may be considered to be equal to the sum of the resistance values of five series-connected resistors $Ra_1$, $Ra_2$, $R_1$, $R_2$, $R_3$ crossed by a fusing current $I_0$. The resistors $R_1$, $R_3$ represent the resistance of the central region 2 on each side of the thinned zone 21 and, in this case, are substantially equal to the resistance $R_0$ per unit of surface area of the material forming the fuse. The resistor $R_2$ represents the resistance of the thinned zone 21 and, in this case, it is substantially equal to $2R_0$. The resistors $Ra_1$ and $R_2$ represent the values of access resistance at the two ends of the fuse 20. The total resistance Rt of the fuse 20 is thus equal to:

$$Ra_1 + Ra_2 + 4R_0,$$

whereas the total resistance of a conventional fuse of the same shape and size is equal to:

$$Ra_1 + Ra_2 + 3R_0.$$

Since the resistance $R_0$ is generally low as compared with the access resistance Ra, the ratio Ic/Vc between the fusing current Ic and the fusing voltage Vc is substantially not modified by providing the thinned zone 21. Furthermore, according to another feature of the invention, to reduce the width $W_2$ of the thinned zone 21 below a technological minimum width $W_{min}$ takes advantage of the so-called proximity optical effect that is present when etching by photolithography. The way in which this phenomenon appears during an etching process will be discussed below.

Figure 5A:
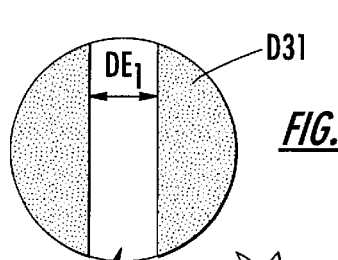
FIGS. 5A to 5C show standard photolithography steps ranging from designing to etching the surface of the integrated circuit, according to the present invention.
Figure 5B:
Figure 5C:
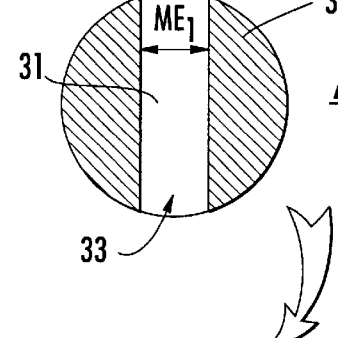

FIG. 5C is a partial view of an etching 30 with parallel edges having a width $E_1$, made for example, in a polysilicon layer 31. FIG. 5A shows the initial pattern of this etching as designed by an integrated circuit designer. The references of FIG. 5C are preceded by the letter D in FIG. 5A. In this example, it is assumed that the width $DE_1$ of the etching D30 as drawn is chosen to be greater than a technological threshold $SE_{min}$. This technological threshold represents the minimum space between two elements below which the proximity optical effect appears.

The drawing step illustrated by FIG. 5A is followed by several standard steps, such as the making of an isolation mask for reproducing the initial pattern and the making of an etching mask. FIG. 5B shows the etching mask 32 corresponding to the drawing of FIG. 5A. The mask 32 is obtained by depositing a layer of photosensitive resin on the polysilicon layer 31. This is followed by a step of isolating the resin by an isolation mask, and a step of removing the isolated resin by a solvent. Finally, the mask 31 has an aperture 33 that reveals the polysilicon 31, whose width $ME_1$ is equal to the width $DE_1$ planned on the initial design. After the polysilicon etching step, which is generally a plasma etching step, the width $E_1$ of the etched zone 30 (FIG. 5C) is, for its part, also equal to the planned width $DE_1$. Typically, the etched zone shows the space between two lines of polysilicon.

Figure 6A:
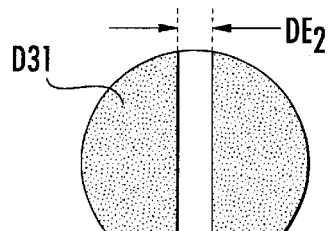
FIGS. 6A to 6C show the steps for etching a smaller width corresponding to the same steps illustrated in FIGS. 5A to 5C, which also illustrates a phenomenon known as the "proximity optical effect;"
Figure 6B:
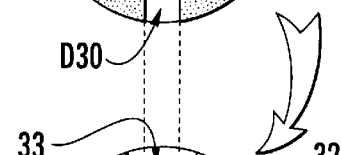
Figure 6C:
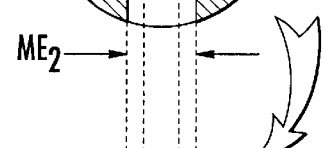

FIGS. 6A to 6C give a view, with the same references, of the same process steps. The planned width $DE_2$ of the etching D30 is now chosen to be smaller than the technological threshold $SE_{min}$. As can be seen in FIG. 6B, the result thereof is that the etching mask 32 has an aperture 33 which is greater than planned. The width $ME_2$ is greater than the width $DE_2$ laid down in the drawing. Thus, in FIG. 6C, the etching 30 also has a width $E_2$ which is greater than that laid down in the design.

As is well known to those skilled in the art, this increase in width is primarily due to the phenomena of refraction and reflection of light during the isolation of the etching mask and sets the limits of a given technology. Naturally, the proximity optical effect also appears when it is sought to obtain a narrow band of material by etching the surrounding material. This defines a technological threshold $SW_{min}$ in width of an element, below which the dimensions as laid down suffer from deterioration. Furthermore, in relation with other technological constraints, such as the reliability of the integrated circuits, the optical proximity effect also determines a technological minimum $E_{min}$ in etching width (minimum space between two elements), as well as a technological minimum width $W_{min}$ in the width of an element. The technological minimum $W_{min}$, $E_{min}$ are generally smaller than the technological thresholds $SW_{min}$, $SE_{min}$ and are obtained by design corrections directed at compensating for the proximity optical effect.

Reference shall now be made to FIGS. 7 and 8 which illustrate a method according to the invention enabling the making of a fuse 20 with a thinned zone 21 having a width $W_2$ smaller than the technological minimum width $W_{min}$. FIG. 7 shows the drawing D20 of the fuse 20 according to the present invention and FIG. 8 shows the fuse 20 obtained after the etching of a layer of polysilicon, metal or alloy. The references of FIG. 8 are preceded by the letter D in FIG. 7. According to the invention, the fuse D20 as drawn does not have a thin zone but, on each side of the central region D21, there are two dummy elements D22, D23 which are polygonal. Each dummy element D22, D23 has a respective edge D22-1, D23-1 parallel to the central region D2 at a distance DE3 from this region. The distance $DE_3$ is deliberately smaller than the technological threshold $SE_{min}$ described above. Furthermore, the width $DW_1$ of the central region D2 is preferably chosen to obtain a fuse width equal to the technological minimum width $W_{min}$.

As can be seen in FIG. 8, the final result after etching is that the distance $E_3$ between the edges 22-1, 23-1 of the dummy elements 22 and 23 and the edges of the central region 2 is increased by the proximity optical effect so that a little material has been lost on the dummy elements 22, 23 and a little material on the edges of the central region 2 facing the dummy elements. The removal of material from the edges of the central region 2 forms two symmetrical notches 21-1, 21-2 revealing the thinned zone 21 whose width $W_2$ is smaller than the technological minimum width $W_{min}$. By pushing back the boundaries imposed by the current technology, an even more appreciable increase is obtained in the density of the fusing current in the thinned zone and, therefore, the fusing efficiency and reliability of the fuse according to the invention.

Figure 9:
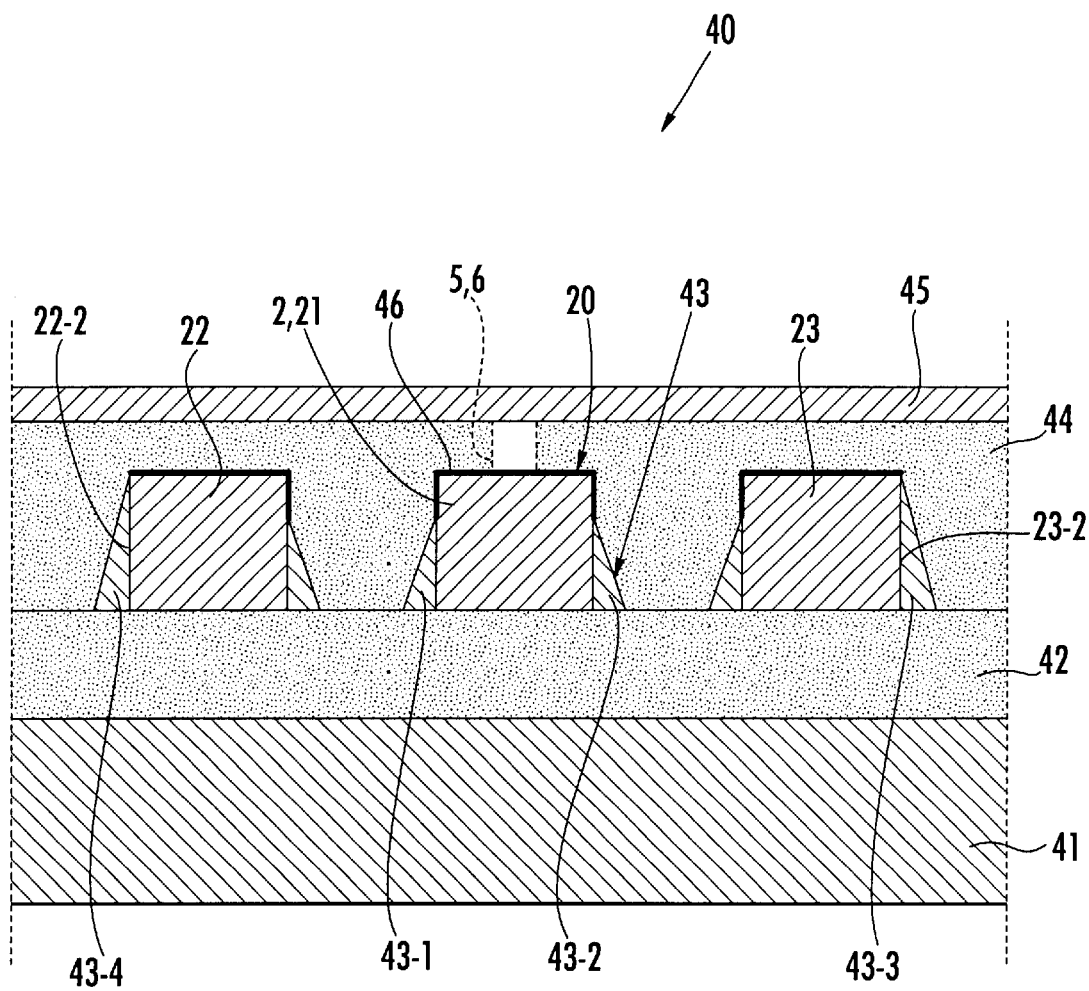
FIG. 9 is a partial sectional view along an axis BB' of the fuse of FIG. 8 placed in an integrated circuit according to the present invention.

A description shall now be given with reference to FIG. 9 of another advantage of this embodiment of the invention, appearing when the fuse is made out of a plasma-etched polysilicon layer. It will be recalled that polysilicon, even when doped, has low conductivity so that it is necessary to provide for a step of silicide treatment in the presence of a metal such as titanium Ti, cobalt Co, tungsten W and tantalum Ta, etc. This step enables the deposition on the surface of polysilicon of a layer of silicide, for example, titanium silicide TiSi2, which greatly reduces the electrical resistivity of polysilicon.

FIG. 9 gives a partial view of an integrated circuit 40 including the fuse 40, seen in the sectional view along the axis BB' shown in FIG. 8. The thicknesses of the various elements are not shown to scale. The integrated circuit 40 conventionally includes a substrate 41, a first thick oxide layer 42, for example, with a thickness of 0.35 micrometers, an etched polysilicon layer forming the fuse 20, for example, with a thickness of 0.2 micrometers, an etched oxide layer 43, a second layer 44 of thick oxide and a metallization layer 45 in which conductors are etched. The contacts 5, 6 represented by dashes are conventionally metallized holes connecting the fuse to the layer metallization 45 or any other metallization planned at a higher level. The etched oxide 43 forms oxide spacers 43-1, 43-2 covering the edges of the central region 2 and the thin part 21. Finally, the fuse 20 is covered with a silicide layer 46 enabling its electrical resistance to be reduced, as already indicated.

As is well known to those skilled in the art, the spacers 43-1, 43-2 are not necessary for the making of the fuse and are provided by the fact that the fuse is made jointly with other elements of the integrated circuit 40, for example, with MOS transistors (not shown). However, the presence of the spacers 43-1, 43-2 on the edges of the fuse 20 has the negative effect of limiting the size of the silicide layer 46.

Here, the advantage of the invention lies in the fact that the efficiency of the process of etching the oxide 43 is improved in the zones where the central region 2 is in the vicinity of the dummy elements 22, 23. This phenomenon, well known to those skilled in the art, is called the "localized charge effect." The result appears clearly when the spacers 43-1, 43-2 present on the edges of the thinned zone 21 are compared, for example, with spacers 43-3, 43-4 present on the external edges 22-2, 23-2 of the dummy elements 22, 23. It can be seen that the spacers 43-3, 43-4 almost entirely cover the external edges of the dummy elements 22, 23, whereas the spacers 43-1, 43-2 only partially cover the edges of the thinned zone 21.

Ultimately, the presence of the dummy elements 22, 23 assists the etching of the oxide 43 on the edges of the fuse and makes it possible to obtain a silicide layer 46 that is more extensive. Since the silicide layer 46 is wider, the electrical resistance of the fuse is smaller than that of a standard fuse of the same size. This advantage improves the current/voltage ratio of the fuse and is added to the other advantages of the invention to give high fusing efficiency and high reliability.

The present invention can have various alternatives and embodiments, especially with regard to the size and shape of the fuse, the ratio between the length L and the width $W_1$ of the central region 2, the positioning of the thinned zone 21, the width $W_2$ of the thinned zone 21, the layout of the fuse within an integrated circuit, and the materials and the technologies used for making the fuse, etc.

In general, the present invention makes it possible, for an identical amount of space occupied by a fuse and under standard conditions of fusing, to obtain a higher current density and a greater fusing energy and also makes it possible to control the localization of the breakdown point of a fuse. The dummy elements arranged as described above is a complementary aspect of the invention making it possible to go beyond the limits dictated by the manufacturing technology. In the prior art, a polysilicon fuse according to the invention may have a thickness of 0.2 micrometers for an average width of about 0.25 micrometers, and a fuse made of metal may have a thickness of 0.5 micrometers for a width of 0.4 micrometers.

That which is claimed is:

1. An integrated circuit fuse comprising:

a substantially rectangular electrically conducting region;

a respective electrical contact zone comprising at least one electrical contact at each end of said substantially rectangular electrically conducting region;

said substantially rectangular electrically conducting region comprising at least one first portion having a first width and at least one second portion having a second width less than the first width so that said at least one second portion forms a weak point facilitating fusing of the integrated circuit fuse by increasing a local current density in the integrated circuit fuse; and at least one dummy element having a spacing from said at least one second portion for providing an optical proximity effect during processing so that the second width is less than the first width.

2. An integrated circuit fuse according to claim 1, wherein the second width is less than about one half of the first width.

3. An integrated circuit fuse according to claim 2, wherein the first width is in a range of about 0.1 to 0.5 microns.

4. An integrated circuit fuse according to claim 1, wherein said at least one second portion is substantially symmetrical with respect to a longitudinal axis of said substantially rectangular electrically conducting region.

5. An integrated circuit fuse according to claim 1, further comprising a pair of dummy elements, one on each side of said at least one second portion.

6. An integrated circuit fuse according to claim 1, wherein said substantially rectangular electrically conducting region and said electrical contact zones comprise polysilicon.

7. An integrated circuit fuse according to claim 6, further comprising oxide spacers partially overlapping edges of said at least one second portion.

8. An integrated circuit fuse according to claim 1, further comprising an oxide layer above said substantially rectangular electrically conducting region; and wherein said at least one electrical contact at each respective end of said substantially rectangular electrically conducting region extends through said oxide layer connecting the integrated circuit fuse with at least one conductive element.

9. An integrated circuit fuse according to claim 1, wherein said at least one second portion has an electrical resistance substantially negligible relative to a total electrical resistance of the integrated circuit fuse; and wherein the total electrical resistance is substantially based upon an electrical resistance of the plurality of electrical contacts.

10. An integrated circuit fuse comprising:

a substantially rectangular electrically conducting region; and a respective electrical contact zone at each end of said substantially rectangular electrically conducting region;

said substantially rectangular electrically conducting region comprising at least one first portion having a first width and at least one second portion having a second width less than the first width; and at least one dummy element having a spacing from said at least one second portion for providing an optical proximity effect during processing so that the second width is less than the first width.

11. An integrated circuit fuse according to claim 10, wherein the second width is less than about one half of the first width.

12. An integrated circuit fuse according to claim 10, wherein said respective electrical contact zone comprises a plurality of electrical contacts.

13. An integrated circuit fuse according to claim 10, wherein the first width is in a range of about 0.1 to 0.5 microns.

14. An integrated circuit fuse according to claim 10, wherein said at least one second portion is substantially symmetrical with respect to a longitudinal axis of said substantially rectangular electrically conducting region.

15. An integrated circuit fuse according to claim 10, wherein said at least one dummy element comprises a pair of dummy elements, one on each side of said at least one second portion.

16. An integrated circuit fuse according to claim 10, wherein said substantially rectangular electrically conducting region and said electrical contact zones comprise polysilicon.

17. An integrated circuit fuse according to claim 16, further comprising oxide spacers partially overlapping edges of said at least one second portion.

18. An integrated circuit fuse according to claim 12, further comprising an oxide layer above said substantially rectangular electrically conducting region; and wherein said plurality of electrical contacts at each respective end of said substantially rectangular electrically conducting region comprise electrical contacts extending through said oxide layer connecting the integrated circuit fuse with at least one conductive element.

19. An integrated circuit fuse according to claim 10, wherein said at least one second portion has an electrical resistance substantially negligible relative to a total electrical resistance of the integrated circuit fuse; and wherein the total electrical resistance is substantially based upon an electrical resistance of the plurality of electrical contacts.

20. A method for forming an integrated circuit fuse comprising:

forming a substantially rectangular electrically conducting region comprising at least one first portion having a first width;

forming at least one dummy element having a spacing from the first width of the substantially rectangular electrically conducting region for providing an optical proximity effect during processing;

forming at least one second portion in the substantially rectangular electrically conducting region to have a second width less than the first width using the optical proximity effect; and forming a respective electrical contact zone comprising at least one electrical contact at each end of the substantially rectangular electrically conducting region.

21. A method according to claim 20, wherein the second width is less than about one half of the first width.

22. A method according to claim 21, wherein the first width is in a range of about 0.1 to 0.5 microns.

23. A method according to claim 20, wherein the at least one second portion is substantially symmetrical with respect to a longitudinal axis of the substantially rectangular electrically conducting region.

24. A method according to claim 20, wherein forming at least one dummy element comprises forming a pair of dummy elements, one on each side of the at least one second portion.

25. A method according to claim 24, further comprising forming oxide spacers partially overlapping edges of the at least one second portion.

26. A method according to claim 20, further comprising forming an oxide layer above the substantially rectangular electrically conducting region; and wherein the at least one electrical contact at each respective end of the substantially rectangular electrically conducting region extends through the oxide layer connecting the integrated circuit fuse with at least one conductive element.

* * * * *